United States Patent [19]
Chun et al.

[11] Patent Number: 5,416,870
[45] Date of Patent: May 16, 1995

[54] OPTOELECTRONIC INTERFACE DEVICE AND METHOD WITH REFLECTIVE SURFACE

[75] Inventors: Christopher K. Y. Chun, Gilbert; Shun-Meen Kuo, Chandler; Michael S. Lebby, Apache Junction, all of Ariz.

[73] Assignee: Motorola, Inc., Schaumburg, Ill.

[21] Appl. No.: 160,761

[22] Filed: Dec. 3, 1993

[51] Int. Cl.⁶ .................... G02B 6/36; H01R 43/00
[52] U.S. Cl. ........................... 385/88; 385/14; 385/49; 385/92; 385/47; 29/832; 29/841; 29/825
[58] Field of Search ............... 385/14, 15, 24, 31, 385/38, 39, 47, 48, 49, 88, 89, 92, 129, 130, 131, 132; 29/825, 827, 831, 832, 836, 837, 841

[56] References Cited

U.S. PATENT DOCUMENTS

| | | |
|---|---|---|
| 4,165,496 | 8/1979 | Di Domenico, Jr. et al. ........ 385/48 |
| 4,314,940 | 2/1982 | Bickel ............................... 385/47 X |
| 4,423,922 | 1/1984 | Porter ................................. 385/47 |
| 4,772,787 | 9/1988 | Trommer ............................. 385/14 |
| 4,897,711 | 1/1990 | Blonder et al. ..................... 385/88 |
| 4,969,712 | 11/1990 | Westwood et al. ................. 385/49 |
| 4,981,334 | 1/1991 | Sniadower ......................... 385/31 |
| 5,073,003 | 12/1991 | Clark ................................. 385/31 |
| 5,127,075 | 6/1992 | Althaus et al. ..................... 385/94 |
| 5,170,448 | 12/1992 | Ackley et al. ..................... 385/31 |
| 5,222,175 | 6/1993 | Tatoh ............................... 385/14 X |
| 5,249,245 | 9/1993 | Lebby et al. ..................... 385/89 |
| 5,337,391 | 8/1994 | Lebby ............................... 385/88 |
| 5,345,524 | 9/1994 | Lebby et al. ..................... 385/88 |

Primary Examiner—Brian Healy
Attorney, Agent, or Firm—Gary F. Witting

[57] ABSTRACT

A substrate (102) having a surface (103) with a plurality of electrical traces (106) disposed thereon is provided. A photonic device (111) is operably mounted on the electrical traces (106) of the substrate (102). An optical portion (121) having a reflective surface (118) that is embedded in the optical portion (121) for directing light to and from the working portion of the photonic device (111) is disposed on the surface (103) of the substrate (102), thereby encapsulating the photonic device (111) in the optical portion (121).

15 Claims, 3 Drawing Sheets

OPTOELECTRONIC INTERFACE DEVICE AND METHOD WITH REFLECTIVE SURFACE

BACKGROUND OF THE INVENTION

This invention relates, in general, to optical devices and, more particularly, to optoelectronic interface devices.

Presently, directing or guiding of optical signals into or out of a working portion of a photonic device is a difficult task. Generally, the working portion of the photonic device either accepts or emits the optical signals perpendicular to a surface of the working portion of the photonic device. However, if the optical signals need to be directed or guided in a different direction, this configuration presents a problem. At present, if the optical signals are required to be guided in a different direction, this task typically is achieved by disposing a reflective surface at an end of a waveguide that the working portion of the photonic device is aligned to. For example, a waveguide is cut or cleaved at a precise angle so as to provide a surface. The surface typically is either coated with a reflective material or a reflective optical element such as a mirror is attached to the surface. However, since waveguides are not easily cleaved or cut at precise angles, the angle is generally compromised, thus not enabling the light signals to be directed in the appropriate direction.

Further, with respect to the application of the reflective material to the cut or cleaved waveguide, it should be noted that the application of the reflective material involves a complicated process that is expensive, thus adding additional cost to a waveguide that may have been cleaved inappropriately. Moreover, with respect to the application of a reflective element to the cleaved surface, with the angle being compromised, the reflective element that is applied or attached to the surface is not capable of reflecting the light signals in an optimum direction, thus not allowing the light signals to be directed optimally from the reflective surface in the desired direction.

By now it should be apparent that the presently used methods and articles for directing light signals in a desired direction have severe problems that limit their use in a production environment. Further, it should be pointed out that application of optical elements by hand incurs a high cost in manufacturing. Thus, a method and an article that enables the directing of optical signals in a desired direction that is cost effective and manufacturable in a high volume manufacturing environment would be highly desirable.

SUMMARY OF THE INVENTION

Briefly stated, a substrate having a surface with a plurality of electrical traces disposed thereon is provided. A photonic device is operably mounted on the electrical traces of the substrate. An optical portion having a reflective surface that is embedded in the optical portion for directing light to and from the working portion of the photonic device is disposed on the surface of the substrate, thereby encapsulating the photonic device in the optical portion.

DETAILED DESCRIPTION OF THE DRAWINGS

Figure 1:
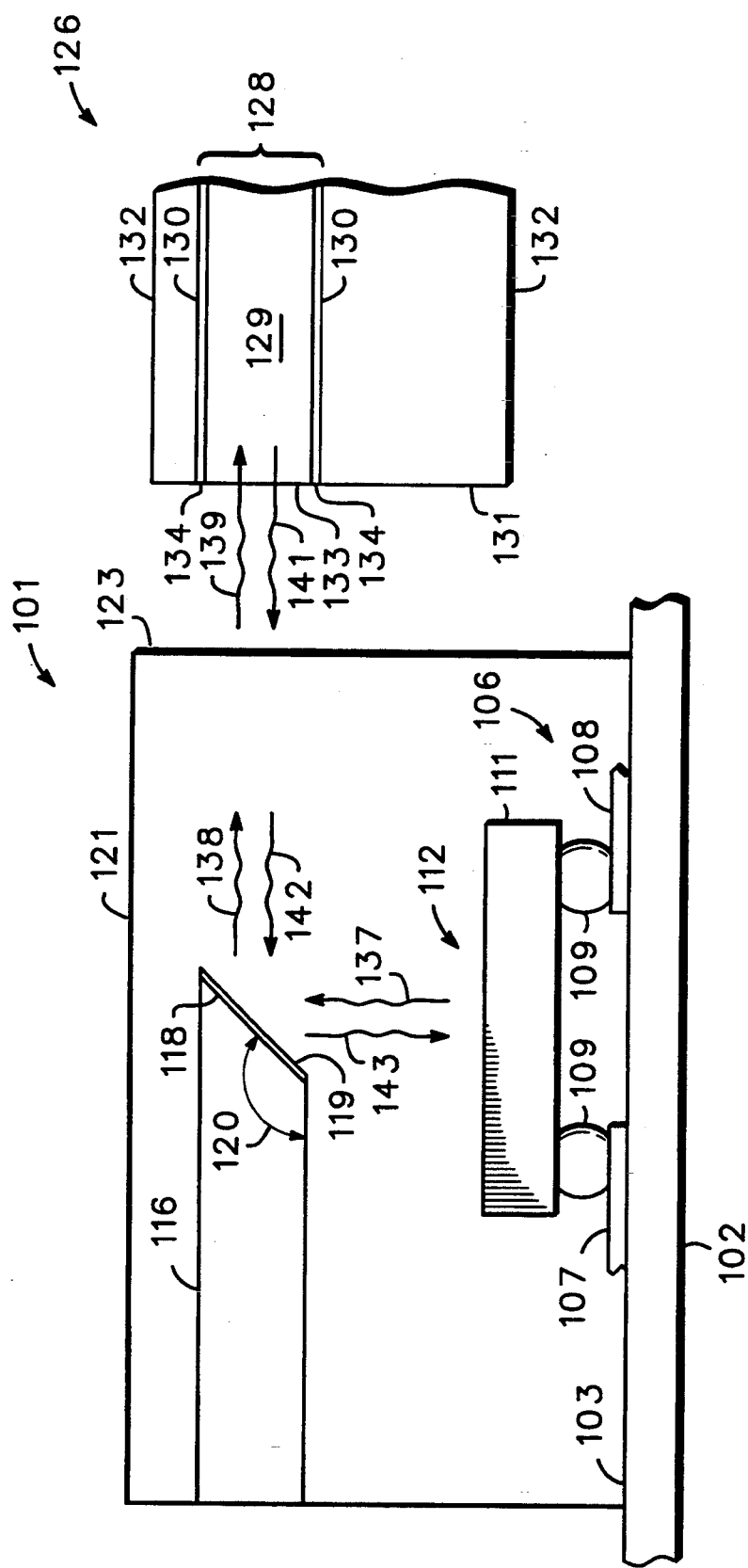
FIG. 1 is a greatly simplified enlarged sectional view of a portion of an optoelectronic interface device.

FIG. 1 is a greatly simplified enlarged sectional view of a portion of an optoelectronic interface device 101. Optoelectronic interface device 101 includes several main features or elements, such as a substrate 102 having a surface 103, a plurality of electrical traces 106, disposed thereon, a photonic device 111 with a working portion 112, a reflective member 116 having a reflective surface 118, and an optical portion 121 having a surface 123.

Additionally, an optical connector 126 is illustrated. Optical connector 126 includes a body 132 and an optical fiber 128. Optical fiber 128 further includes a core region 129 and cladding regions 130. Body 132 generally is formed such that cross-sectional surfaces 133 and 134 of optical fiber 128 are exposed on surface 131 of optical connector 126.

It should be understood that FIG. 1 illustrates only a small portion of both optoelectronic interface device 101 and optical connector 126, thus FIG. 1 does not represent any particular size or dimensionality of either optoelectronic interface device 101 or optical connector 126. It should be further understood that optoelectronic interface device 101 and optical connector 126 are capable of extending into and out of FIG. 1, thus enabling a plurality of the main elements to exist in optoelectronic interface device 101 and optical connector 126. Further, it should be understood that FIG. 1 has been greatly simplified in order to better illustrate the present invention, thus specific engineering details have been deliberately omitted so as to present the present invention more clearly.

Referring now to FIG. 1, substrate 102 is made of any suitable substrate, such as a ceramic interconnect substrate, a FR4 substrate, a printed circuit board (PCB), or the like. However, it should be understood that selection of a specific type of substrate that is used for substrate 102 is application specific and determines the complexity of routing of electrical signals throughout substrate 102, as well as specific output mechanisms, such as pins as in a pin grid array (PGA) package, lead frame members as in a lead frame package, or the like.

The plurality of electrical traces 106 are disposed on surface 103 of substrate 103 by any well-known method in the art. Typically, the plurality of electrical traces 106 are made by a combination of well-known process, such as deposition and patterning. As illustrated in FIG. 1, the plurality of electrical traces includes electrical traces 107 and 108. However, it should be understood that electrical traces 107 and 108 only illustrate only a small portion of a total of electrical traces that are capable of being disposed on or into substrate 102.

Photonic device 111 having working portion 112 is mounted on and electrically coupled to the plurality of electrical traces 106, thereby electrically connecting photonic device 111 to the plurality of electrical traces 106. Mounting of photonic device 111 to the plurality of electrical traces 106 is achieved by any suitable method, such as manually, semi-automatically, or automatically. However, in preferred embodiment of the present invention, mounting of photonic device 111 to the plurality of electrical traces 106 is achieved automatically by utilizing an automated system (not shown), such as a robot or a robotic arm. Additionally, electrical connection between photonic device 111 and the plurality of electrical traces 106 is achieved by any suitable method, such as TAB bonding, wire bonding, conductive balls, or the like.

By way of example only, as shown by FIG. 1, photonic device 111 is electrically connected to the plurality of electrical traces 106 by bump balls 109, thus enabling electrical signals to flow into and out of photonic device 111 and the plurality of electrical traces 106. Additionally, it should be understood that with photonic device 111 being positioned and mounted with a robotic arm, the precision of placement of photonic device 111 to the plurality of electrical traces 106 is greatly increased.

Photonic device 111 is capable of being either a phototransmitter or a photoreceiver. More specifically, if photonic device 111 is a phototransmitter, any suitable phototransmitter, such as a laser (e.g. a vertical cavity surface emitting laser (VCSEL), a light emitting diode (LED)), or the like is used. Alternatively, if photonic device 111 is a photoreceiver any suitable photoreceiver, such as a photodiode, a PIN photodiode, or the like is used.

Member 116 is made from any suitable material, such as a ceramic material, a metal material, a plastic material, or the like. Member 116 is made having a surface 118 that is reflective in itself or is capable of being made reflective. For example, if member 116 is made of a plastic material that is nonreflective, a reflective coating 119 is applied to surface 118 of member 116, thereby making surface 118 more reflective. Further, it should be understood that reflective coating 119 is capable of being applied to surface 118 even though the material used to make member 116 is already reflective, thereby enhancing the reflectivity of surface 118.

Reflective coating 119 is made of any suitable material, such as gold, silver, aluminum, tungsten, or any suitable alloy, such as titanium tungsten, copper/aluminum or the like. Reflective coating 119 is applied to surface 118 by any suitable method, such as evaporation, sputtering, laminating, or the like. Further, surface 118 is made having angle 120 set at any suitable angle. Typically, angle 120 ranges between 120 degrees to 150 degrees with a preferable range between 130 degrees to 140 degrees, and in a preferred embodiment of the present invention angle 120 is set at 135 degrees. Generally, shaping of member 116 is accomplished by any suitable means, such as milling, molding, stamping, cleaving, or the like.

In a preferred embodiment of the present invention, a metal material is selected to form member 116. Generally, member 116 is part of a larger assembly or lead frame (not shown in FIG. 1). The metal member 116 is shaped by stamping or cutting the metal material so as to impart a general shape and to provide surface 118, as well as bending member 116 to an appropriate configuration (not shown). If necessary, other processes or procedures are done to member 116, such as applying a reflective layer 119 to surface 118, polishing surface 118, or the like. It should be understood that selection of different materials requires different shaping techniques. Further, it should be understood that surface 118 of member 116 can be formed in a variety of shapes, such as a flat surface, a curved surface, or the like.

Optoelectronic interface device 101 includes optical portion 121. Optical portion 121 is made of any suitable material, such as epoxies, polyimides, polymers, or the like. Typically, optical portion 121 is made by any suitable method such as transfer molding, injection molding, or the like. For example, with substrate 102 being prepared with photonic device 111 mounted on the plurality of electrical traces 106 and with member 116 being positioned over working portion 112, optical portion 121 is overmolded or disposed on the prepared substrate 102, thereby positioning surface 118 of member 116 rigidly in place over working portion 112 of photonic device 111.

In function, with photonic device 111 being a phototransmitter, light is emitted from working portion 112, indicated by arrow 137. The light, indicated by arrow 137, strikes surface 118 and is reflected off of surface 118, as indicated by arrow 138. The reflected light, indicated by 138, passes through optical portion 121, as well as through surface 123 and into core region 129, indicated by arrow 139 of optical fiber 128. Alternatively, with photonic device 111 being a photoreceiver, light, indicated by arrow 141, travels through core region 129 of optical fiber 128. The light, indicated by arrow 141, passes through surface 131 of optical connector 126 and through surface 123 of optical portion 121, thereby entering optical portion 121. The light, indicated by arrow 142, passes through optical portion 121 and strikes surface 118, thereby reflecting the light off surface 118, indicated by arrow 143. The reflected light, indicated by arrow 143 is now directed toward working portion 112 of photonic device 111.

Figure 2:
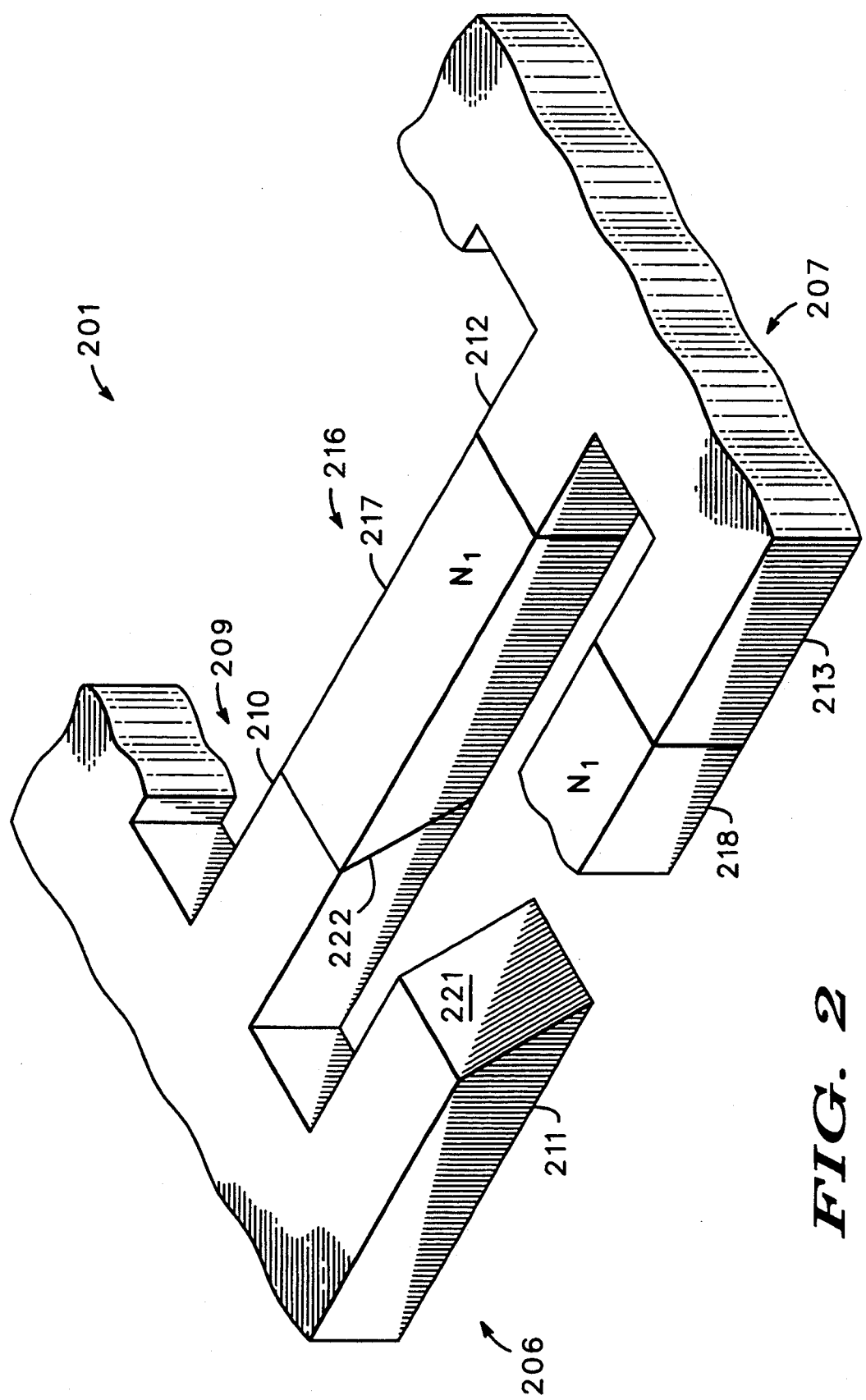
FIG. 2 is a greatly simplified perspective view of a portion of an optical lead frame, having portions thereof removed and shown in section.

FIG. 2 is a simplified portion of a greatly enlarged perspective view of an optical lead frame 201, shown with portions thereof removed and illustrated in section. Optical lead frame 201 includes several main features or elements, such as first and second lead frame portions 206 and 207, a plurality of lead frame members 209, and a plurality of waveguide portions 216. Additionally, the plurality of lead frame members 209 and the plurality of waveguide portions are illustrated by lead frame members 210 and 211 and waveguide portions 217 and 218, respectively. It should be understood that FIG. 2 illustrates only a small portion of optical lead frame 201, thus FIG. 2 does not represent any particular size or dimensionally of optical lead frame 201. Further, it should be understood that FIG. 2 has been greatly simplified in order to better illustrate the present invention, thus specific engineering details have been deliberately omitted.

Referring now to FIG. 2, the first and the second lead frame portions 206 and 207 are made of any suitable material, such as plastics, epoxies, metals, ceramics, or the like. However, it should be understood that selection of specific materials for making first and second lead frame portions 206 and 207 determines specific processing steps used for that specific material for manufacturing lead frame portions 206 and 207.

For example, if first and second lead frame portions are made of plastics or epoxies, first and second lead frame portions 206 and 207 typically are molded, thereby producing first and second lead frame portions 206 and 207 with lead frame members 210 through 213, respectively. Further, it should be understood that surfaces 221 and 222 are capable of being made during the molding process to provide lead frame portion 206 and 207.

In another example, with first and second lead frame portions 206 and 207 made of a metal or metal alloy, the metal or metal alloy is cut or stamped into the appropriate form by well-known methods in the art to provide the first and second lead frame members 206 and 207, as well as lead frame members 210 through 213. Additionally, during the cutting or forming of first and second lead frame portions 206 and 207, surfaces 221 and 222 are capable of also being formed simultaneously. Reflectivity optimization of surfaces 221 and 222 typically is achieved by any suitable method in the art, such as polishing, applying a reflective material, or the like.

The plurality of waveguide portions 216 are made of any suitable material, such as epoxies, polyimides, polymers, or the like. These materials generally have a refractive index of between 1.4 to 1.7. The selection of refractive index is application specific and is dependent upon subsequent processing steps which are more fully discussed hereinafter. Generally, the plurality of a waveguide portions 216 are molded. More specifically, first and second lead frame portions 206 and 207 with lead frame members 210 through 213 are placed in a molding system (not shown). The molding system defines a cavity that is inversely related to an area defined by the plurality of waveguide portions 216. The molding materials are then injected into the cavity so as to define the plurality of waveguide portions 216, thereby molding the plurality of waveguide portions to the plurality of lead frame members 209. Optical lead frame 201 is subsequently cured.

Figure 3:
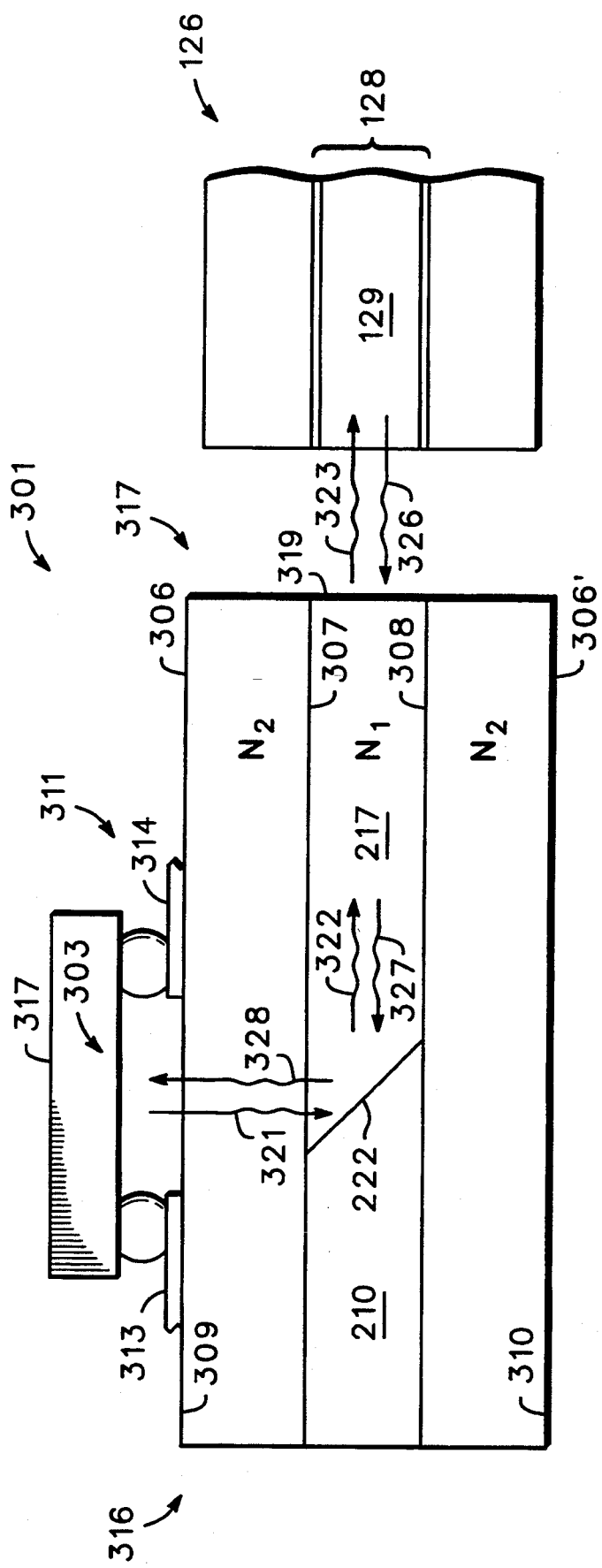
FIG. 3 is a greatly simplified enlarged sectional view of a portion of an optoelectronic interface device employing the optical lead frame illustrated in FIG. 2.

FIG. 3 is a greatly enlarged simplified portion of an optoelectronic interface device 301 employing optical lead frame 201 as shown in FIG. 2 illustrated in sectional view. Similar elements or features that have been previously described or discussed in FIG. 2 will retain their original identifying numerals in FIG. 3. It should be understood that FIG. 3 illustrates only a small portion of optical interface device 301, thus FIG. 3 does not represent any particular size or dimensionality of optical interface device 301. Since optical interface device 301 is illustrated in sectional view, it should be understood that optical interface device can extend both into and out of FIG. 3. Further, it should be understood that FIG. 3 has been greatly simplified in order to better illustrate the present invention, thus specific engineering details have been deliberately omitted.

Cladding regions 306 and 306' are made of any suitable material such as epoxies, polyimides, polymers, or the like. Additionally, waveguide portion 217 is made of materials described hereinabove. Generally, both the materials used for making cladding regions 306 and 306' and waveguide portion 217 have well-known refractive index characteristics identified as N2 and N1, respectively. Typically, these refractive indexes range from 1.4 to 1.7; however, in the present invention, the refractive index of waveguide portion 217 is at least 0.01 higher than the refractive index of cladding regions 306 and 306'. Further, it should be understood by those skilled in the art that cladding region 306' is not necessary for the operation of the present invention. However, by utilizing cladding region 306' a more effective waveguide is made.

Generally, cladding regions 306 and 306' are applied by any suitable method, such as laminating, molding, or the like. However, in a preferred embodiment of the present invention, cladding region 306 and 306' are formed by molding. By way of example only, with optical lead frame 201 being formed, optical waveguide 201 is placed in a molding system (not shown) that defines outer perimeters or surfaces, such as surfaces 309 and 310 of optical interface device 301. Molding material previously selected with the appropriate refractive index is injected into the cavity that is defined by the molding system, thereby forming cladding regions 306 and 306'. Once cladding regions 306 and 306' have been formed by injection of the molding material into the cavity of the molding system, cladding regions 306 and 306' are cured and removed from the molding system. End surfaces 316 and 317 are now formed by any suitable method well known in the art, such as cleaving, abrasion, or the like. However, in a preferred embodiment of the present invention, end surfaces 316 and 317 are cleaved so as to remove undesirable portions of lead frame portion 206 and lead frame portion 207 with a portion of waveguide 217, thereby exposing a cross sectional area 319 of waveguide portion 217.

A plurality of electrical traces 311 is formed by well-known methods in the art on surface 309 of cladding region 306. The plurality of electrical traces 311 includes electrical traces 313 and 314 that conduct electrical impulses to or from photonic device 317. It should be understood that a plurality of electrical traces 311 typically are connected to other electrically oriented circuits or standard electronic circuits(not shown), thus operably connecting photonic device 317 to a variety of standard electrical components (not shown) through the plurality of electrical traces 311.

Further, it should be understood that the plurality of electrical traces 311 are capable of being formed while optical waveguide 201 still has lead frame portions 206 and 207 attached, thereby allowing lead frame portions 206 and 207 to be used as handles for aligning the plurality of electrical traces 311 to reflective surface 222.

Photonic device 317 can be either a photoreceiver or a phototransmitter as previously described in FIG. 1. Further, as also described in FIG. 1, photonic device 317 is typically mounted on the plurality of electrical traces 311 by an automated system such as a robot or a robotic arm, or the like.

In function and by way of example, with photonic device 317 being a phototransmitter light signals, indicated by arrow 321, are emitted from working portion 303 of photonic device 317 toward surface 222. The light signals then strike surface 222 and are reflected, indicated by arrow 322, toward cross sectional surface 319 of optical interface device 301. The light signals pass through cross sectional area 319 and into core region 129 of optical connector 126.

Alternatively, with photonic device 317 being a photoreceiver, light signals, indicated by arrow 326, pass through cross sectional surface 319 and into core region 217, indicated by arrow 327. The light signals directed toward surface 222 are reflected off of surface 222 and are directed towards photonic 317, as indicated by arrow 328.

By now it should be appreciated that a novel optical interface device and method for making same have been described. The optical interface device efficiently directs light signals in an appropriate and desired direction as well as being able to be quickly and efficiently manufactured. Further, by enabling quick and efficient manufacturing of optical interface devices allows their usage with optical electronic modules with standard electronic components. Additionally, molding of the optical interface device allows for an inexpensive process for combining both standard electronic components and optical components.

We claim:

1. An optoelectronic interface device comprising:
   a substrate having a plurality of electrical traces disposed thereon;
   a photonic device having a working portion operably mounted on the plurality of electrical traces;
   an optical portion disposed on the substrate encapsulating the photonic device; and
   a lead frame member having a reflective surface embedded in the optical portion for directing light to and from the working portion of the photonic device.

2. An optoelectronic interface device as claimed in claim 1 wherein the photonic device is a phototransmitter.

3. An optoelectronic interface device as claimed in claim 2 wherein the phototransmitter is selected from a group of comprising: a light emitting diode and a laser.

4. An optoelectronic interface device as claimed in claim 3 wherein the laser is a vertical cavity surface emitting laser.

5. An optoelectronic interface device as claimed in claim 1 wherein the photonic device is a photo receiver.

6. An optoelectronic interface device as claimed in claim 5 wherein the photoreceiver is a P-I-N photodiode.

7. An optoelectronic interface device comprising:
   a reflective core region having an optical core region with a first end and a second end and a lead frame member having a reflective surface; wherein the first end of the optical core region is affixed to the reflective surface; and
   a cladding region having a first surface disposed on the optical core region covering the optical core region and positioning the first surface substantially parallel to the optical core region.

8. An optoelectronic interface device as claimed in claim 1 further comprising:
   a plurality of electrical traces disposed on the first surface of the cladding region; and
   a photonic device operably coupled to the plurality of electrical traces disposed on the cladding region.

9. An optoelectronic interface device as claimed in claim 8 wherein the photonic device is a phototransmitter.

10. An optoelectronic interface device as claimed in claim 8 wherein the phototransmitter is selected from a group of comprising: a light emitting diode and a laser.

11. An optoelectronic interface device as claimed in claim 10 wherein the laser is a vertical cavity surface emitting laser.

12. An optoelectronic interface device as claimed in claim 8 wherein the photonic device is a photoreceiver.

13. An optoelectronic interface device as claimed in claim 12 wherein the photoreceiver is a P-I-N photodiode.

14. A method for making an optoelectronic interface comprising the steps of:
   providing a substrate having a plurality of electrical traces disposed thereon;
   mounting a photonic device having a working portion on the plurality of electrical traces; and
   disposing a lead frame having a reflective surface into an optical portion, thereby embedding the reflective surface in the optical portion for directing light to and from the working portion of the photonic device.

15. An optical lead frame comprising:
   a lead frame member having a reflective surface positioned at a predetermined angle; and
   an waveguide portion affixed to the reflective surface of the lead frame member extending away from the lead frame member.

* * * * *